(12) United States Patent
Hawwa

(10) Patent No.: US 8,944,148 B2
(45) Date of Patent: Feb. 3, 2015

(54) ADD-ON HEAT SINK

(75) Inventor: Muhammad A. Hawwa, Dhahran (SA)

(73) Assignee: King Fahd University of Petroleum and Minerals, Dhahran (SA)

( * ) Notice: Subject to any disclaimer, the term of this patent is extended or adjusted under 35 U.S.C. 154(b) by 282 days.

(21) Appl. No.: 13/556,135

(22) Filed: Jul. 23, 2012

(65) Prior Publication Data

US 2014/0020863 A1 Jan. 23, 2014

(51) Int. Cl.
*H01L 23/40* (2006.01)
*H05K 7/20* (2006.01)

(52) U.S. Cl.
CPC ............ *H01L 23/40* (2013.01); *H05K 7/20172* (2013.01)
USPC ............................ 165/80.1; 361/704; 165/185

(58) Field of Classification Search
CPC ............................ H05K 7/20172; H01L 23/40
USPC ......................... 165/185, 80.3, 80.1; 361/704
See application file for complete search history.

(56) References Cited

U.S. PATENT DOCUMENTS

| | | | |
|---|---|---|---|
| 3,974,918 A | 8/1976 | Yaremchuk | |
| 4,190,879 A * | 2/1980 | Tissot | 361/720 |
| 4,532,153 A | 7/1985 | Sole | |
| 5,288,203 A * | 2/1994 | Thomas | 165/80.3 |
| 5,544,488 A | 8/1996 | Reid | |
| 5,864,088 A * | 1/1999 | Sato et al. | 174/386 |
| 6,040,362 A | 3/2000 | Mine et al. | |
| 6,206,087 B1 * | 3/2001 | Nakase et al. | 165/80.3 |
| 6,208,516 B1 * | 3/2001 | Fangonilo et al. | 361/704 |
| 6,865,083 B2 | 3/2005 | Liu | |
| 7,280,363 B2 | 10/2007 | Reyzin et al. | |
| 7,613,005 B2 | 11/2009 | Kuo et al. | |
| 7,834,444 B2 | 11/2010 | Awad et al. | |
| 2007/0248460 A1 * | 10/2007 | Su | 415/213.1 |
| 2007/0253165 A1 | 11/2007 | Glowinke | |
| 2007/0296533 A1 | 12/2007 | Springett | |
| 2008/0227379 A1 * | 9/2008 | Hung | 454/184 |
| 2012/0120608 A1 * | 5/2012 | Guan | 361/704 |

FOREIGN PATENT DOCUMENTS

GB  2 431 213 A  4/2007

* cited by examiner

*Primary Examiner* — Tho V Duong
*Assistant Examiner* — Aaron Isenstadt
(74) *Attorney, Agent, or Firm* — Richard C Litman

(57) ABSTRACT

The add-on heat sink includes an elongate base having a plurality of fins extending from a surface thereof. A magnetic layer is disposed on the bottom of the base, which permits the add-on heat sink to be installed on any ferromagnetic heated surface. The magnetic layer is composed of either a polymer matrix having a plurality of thermally conductive structural components and a plurality of magnetic particles dispersed therein, or a thermally conductive polymer having magnetic particles dispersed therein. Alternatively, if the heated surface is not ferromagnetic, the heat sink may be magnetically attached by adhesively attaching mating magnetic and ferromagnetic pads to the heat sink and to the heated surface. This configuration allows the add-on heat sink to be installed with minimal footprint. Optionally, a fan may be magnetically attached to the heat sink to cool the heated surface by both conduction and convection.

5 Claims, 5 Drawing Sheets

ADD-ON HEAT SINK

BACKGROUND OF THE INVENTION

1. Field of the Invention

The present invention relates to heat transfer devices, and particularly to an add-on heat sink for easy connection to and dissipation of heat from heated structures.

2. Description of the Related Art

Many common electro-mechanical devices used at home, office and elsewhere generate excessive amounts of heat. This can lead to failure, decrease in performance, and/or production of undesirable electromagnetic noise. In some cases, this can lead to a perception of low quality when the device is actually functioning well and as intended.

Traditionally, heat levels in a heated structural element have been reduced in a passive manner by mounting a heat sink on the surface of the structure. Two methods have been commonly applied to facilitate this. One uses a thermally conductive adhesive and the other utilizes mechanical means, such as screws, clips and other types of fasteners.

In the case of the former, a thermal adhesive is a relatively complicated process. It requires maintaining a certain amount of pressure for extended amount of time, as well as time for the adhesive to cure. In the case of the latter, there must be enough real estate for placement of the heat sink and the hardware. The actual connection also induces structural stress to the connected area. Either method is restrictive in terms of time, effort, and the potential for damage to the structure.

In light of the above, it would be a benefit in the art of heat transfer devices to provide a heat sink that can be installed with minimal space requirements and without harmful structural stress. Thus, an add-on heat sink solving the aforementioned problems is desired.

SUMMARY OF THE INVENTION

The add-on heat sink includes an elongate base having a plurality of fins extending from a surface thereof. A magnetic layer is disposed on the bottom of the base, which permits the add-on heat sink to be installed on any ferromagnetic heated surface. The magnetic layer is composed of either a polymer matrix having a plurality of thermally conductive structural components and a plurality of magnetic particles dispersed therein, or a thermally conductive polymer having magnetic particles dispersed therein. Alternatively, if the heated surface is not ferromagnetic, the heat sink may be magnetically attached by adhesively attaching mating magnetic and ferromagnetic pads to the heat sink and to the heated surface. This configuration allows the add-on heat sink to be installed with minimal footprint and negative structural impact on the heated structure, Optionally, a fan may be magnetically attached to the heat sink to cool the heated surface by both conduction and convection.

These and other features of the present invention will become readily apparent upon further review of the following specification and drawings.

BRIEF DESCRIPTION OF THE DRAWINGS

Similar reference characters denote corresponding features consistently throughout the attached drawings.

DETAILED DESCRIPTION OF THE PREFERRED EMBODIMENTS

Figure 1:
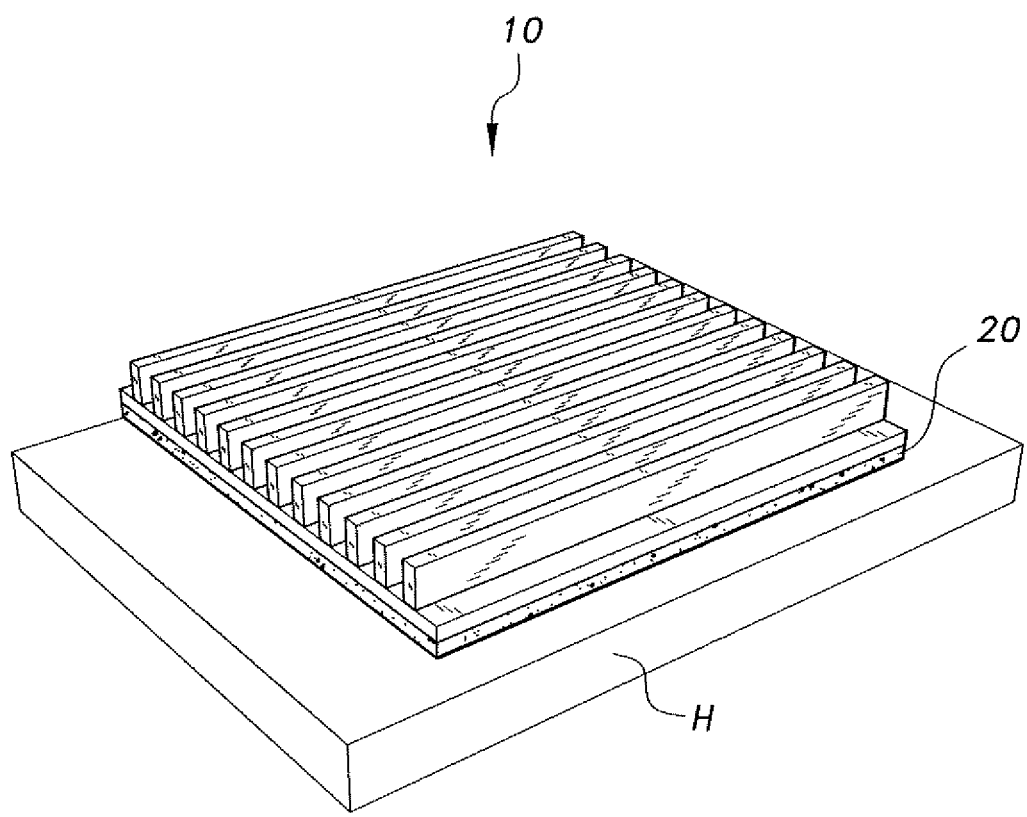
FIG. 1 is an environmental, perspective view of an add-on heat sink according to the present invention.
Figure 2:
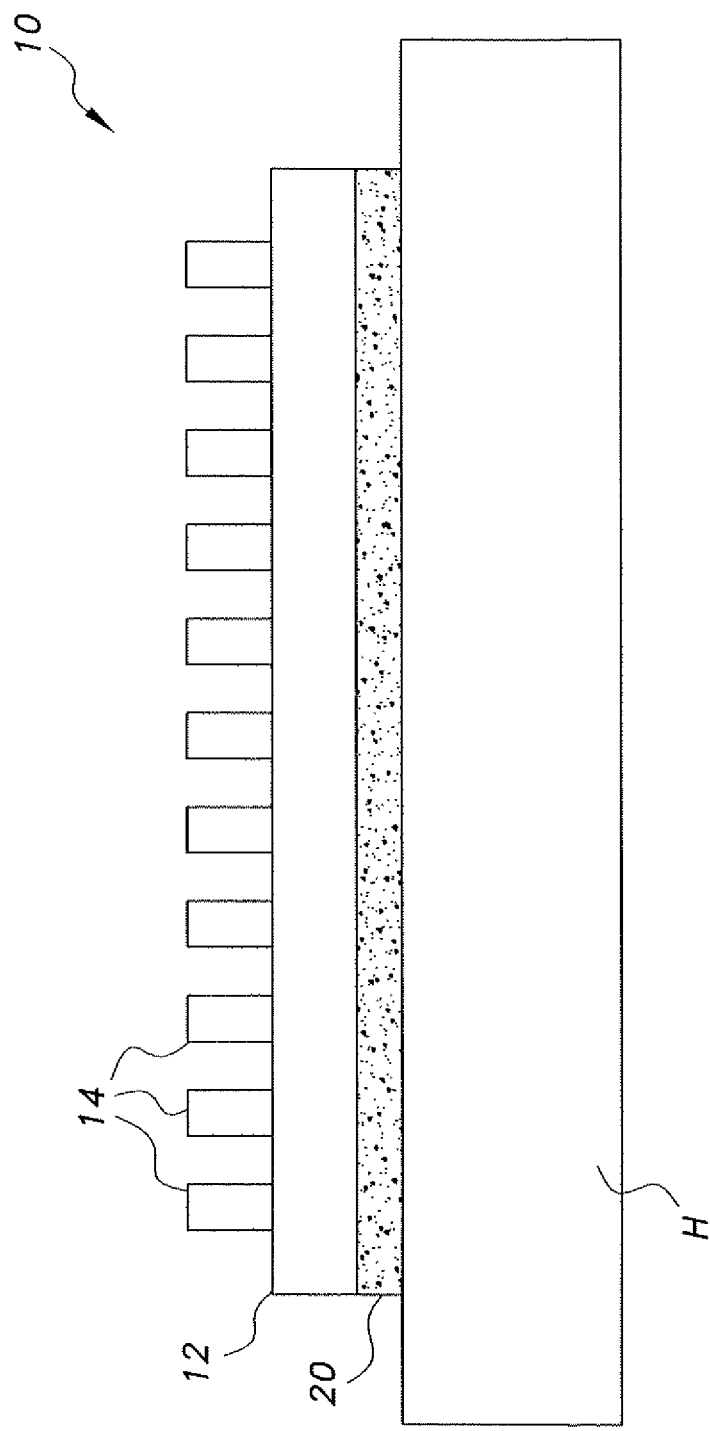
FIG. 2 is an environmental side view of the add-on heat sink shown in FIG. 1.

The add-on heat sink, the first embodiment of which is generally referred to by the reference number 10, provides fast and easy installation of the heat sink in minimal space. As shown in FIGS. 1 and 2, the add-on heat sink 10 includes an elongate base 12 and a plurality of extending fins 14 (for providing greater surface area for the dissipation of heat) attached to the base 12. The base can be a rectangular plate constructed from thermally conductive plastics, metals, composites and/or combinations thereof. The fins 14 are constructed as smaller rectangular plates extending perpendicularly from the top surface of the base 12 and made from similar materials. Although the fins 14 are shown to be rectangular, any shape can be used to construct the fins 14. Additionally, the fins 14 can be arranged in various configurations, such as a fan shape, and may extend at non-perpendicular angles and lengths, so long as the desired heat transfer performance is maintained. The fins 14 provide increased surface area for heat to dissipate, and the performance thereof can be varied by changing the dimensions and the number of fins connected to the base 12 for the given composition of the fins 14. As a general rule, the greater the number of fins within a given volume of space, the greater the increase in the surface area, which promotes increased heat transfer.

In order to mount the add-on heat sink 10, the base 12 includes a magnetic layer 20 attached to the bottom thereof. The magnetic layer 20 permits the add-on heat sink 10 to easily attach onto a ferromagnetic surface on the heated structure H, e.g., when the heated structure has a ferromagnetic housing or a ferromagnetic plate attached to its housing. This manner of installation eliminates any additional monitoring for curing purposes, as in the case of thermally conductive adhesives, and does not impact on the structural integrity of the heated structure H.

Figure 3A:
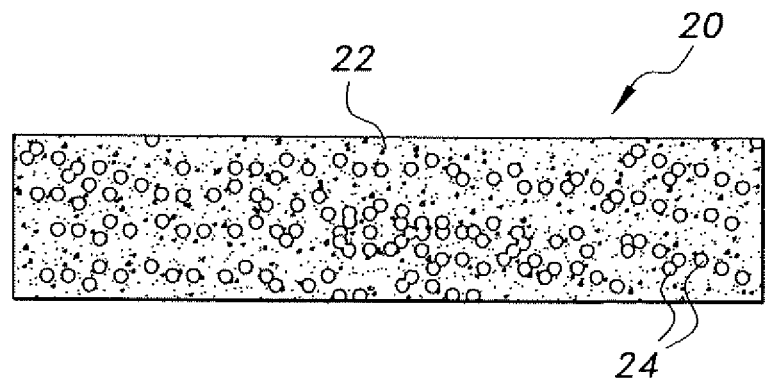
FIG. 3A is a side view in section of the magnetic attachment layer of the add-on heat sink shown in FIG. 1.

As best shown in FIG. 3A, the magnetic layer 20 is preferably a thermally conductive epoxy layer constructed from a matrix of thermally conductive polymeric material 22 having a plurality of magnetic particles or granules 24 embedded therein. Some examples of thermally conductive polymers include polymers hosting conductive particles taught by Mine et al. (U.S. Pat. No. 6,040,362), the teachings of which are hereby incorporated by reference in its entirety, or thermoplastic resins with the ability to transfer heat, such as CoolPoly D2® and CoolPoly E2®, distributed by Cool Polymers, Inc.

Figure 3B:
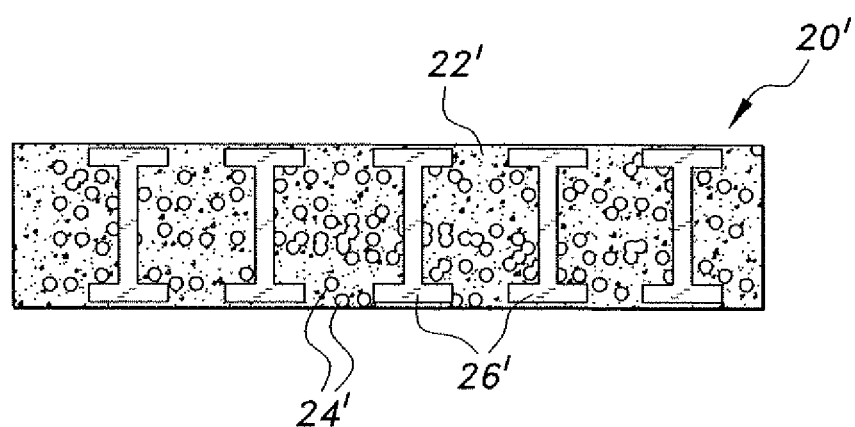
FIG. 3B is a side view in section of an alternative embodiment of a magnetic attachment layer for the add-on heat sink shown in FIG. 1.

An alternative embodiment of the magnetic layer 20' is shown in FIG. 3B. In this embodiment, the magnetic layer 20' is a polymer matrix 22' having a plurality of magnetic particles or granules 24' and a plurality of spaced, thermally conductive structural components 26' embedded therein. Although the structural components 26' are shown having an I-beam or II-beam configuration in FIG. 3B, the structural components may have any suitable configuration for conducting heat through the polymer matrix 22'. It can be seen that the magnetic layer 20' is substantially the same as the magnetic layer 20 with the exception of the thermally conductive structural components 26'.

Figure 4A:
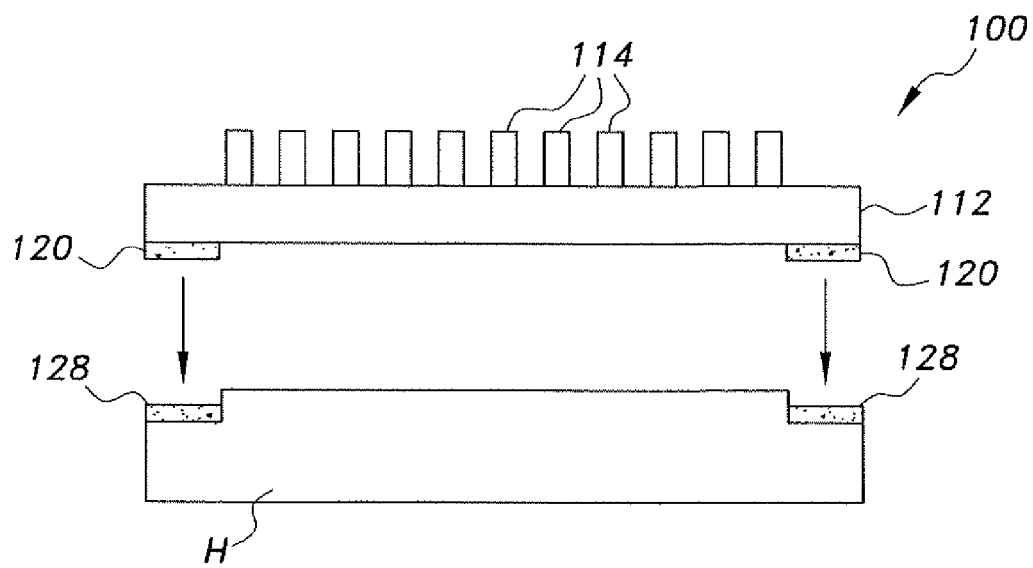
FIG. 4A is an exploded environmental side view of an alternative embodiment of an add-on heat sink according to the present invention.
Figure 4B:
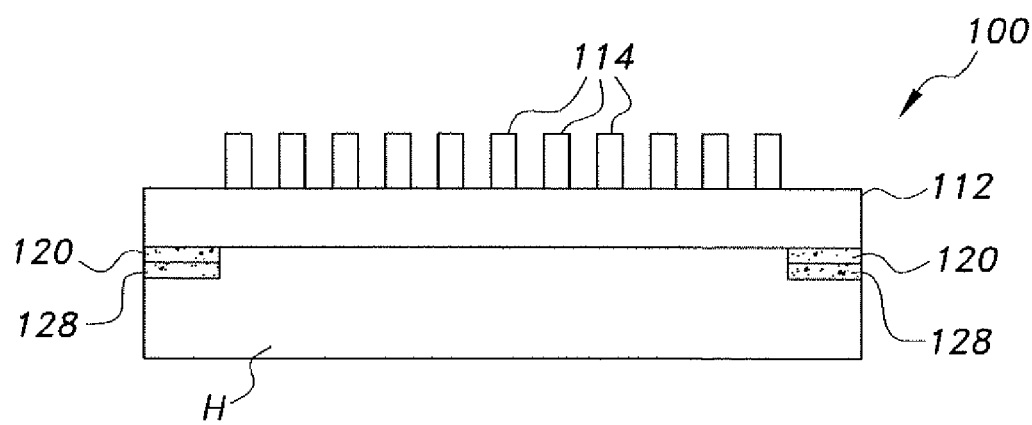
FIG. 4B is an environmental side view of the add-on heat sink of FIG. 4A, shown after attachment to a heated structure.

FIGS. 4A and 4B show an alternative embodiment of an add-on heat sink 100. This embodiment facilitates selective installation of the add-on heat sink 100 to heated structures H that do not have a ferromagnetic housing or ferromagnetic heat transfer plate. As shown, the add-on heat sink 100 includes an elongate base 112, a plurality of heat fins 114 extending from a surface of the base 112, and a pair of first spaced magnetic or ferromagnetic layers or pads 120 at the bottom of the base 112. This arrangement forms a stepped configuration on the bottom of the add-on heat sink 100. Correspondingly, the heated structure H may include recesses formed in its housing, or in a thermally conductive mounting plate attached to its housing. Each recess includes a second magnetic or ferromagnetic pad 128 capable of magnetic attachment with the first pads 120. The add-on heat sink 100 is attached to the heated structure H by mutual magnetic attraction between the magnetic or ferromagnetic pads 120 and 128. These pads 120, 128 can be constructed similar to the aforementioned magnetic layers 20, 20'. Moreover, the pads 120, 128 can be provided as discreet tabs or elongate strips. Alternatively, the pads 120, 128 may be provided as four discrete pads, one at each corner of a rectangular base 112.

The recesses enable the bottom surface of the base 112 to abut or lie flush against the heated structure H (or a thermally conductive mounting plate attached to the heated structure H) to ensure heat transfer between the heat sink 100 and the heated structure H by conduction or direct contact over a large surface area. It will be obvious that the heated structure may lack recesses, the pads 128 extending above the surface of the heated structure H, while the base 112 of the heat sink 100 may have recesses formed therein and the pads 120 may be mounted in the recesses, the recesses in the base 112 having sufficient depth so that the pads 128 on the heated structure's surface extend into the recesses in the heat sink base 112 when the pads 120, 128 mate in order to ensure a large area of direct surface contact between the base 112 and the heated structure H for efficient heat transfer.

Either both pads 120, 128 may be magnetic, or one pad 120, 128 may be magnetic while the other pad 120, 128 may be ferromagnetic. Magnetic polarity should not be a factor for insuring positive connection between the add-on heat sink 100 and the heated structure H. However, the pads 120, 128 can be constructed so that one exhibits an opposite polarity from the other for even greater magnetic attractive force.

Figure 5A:
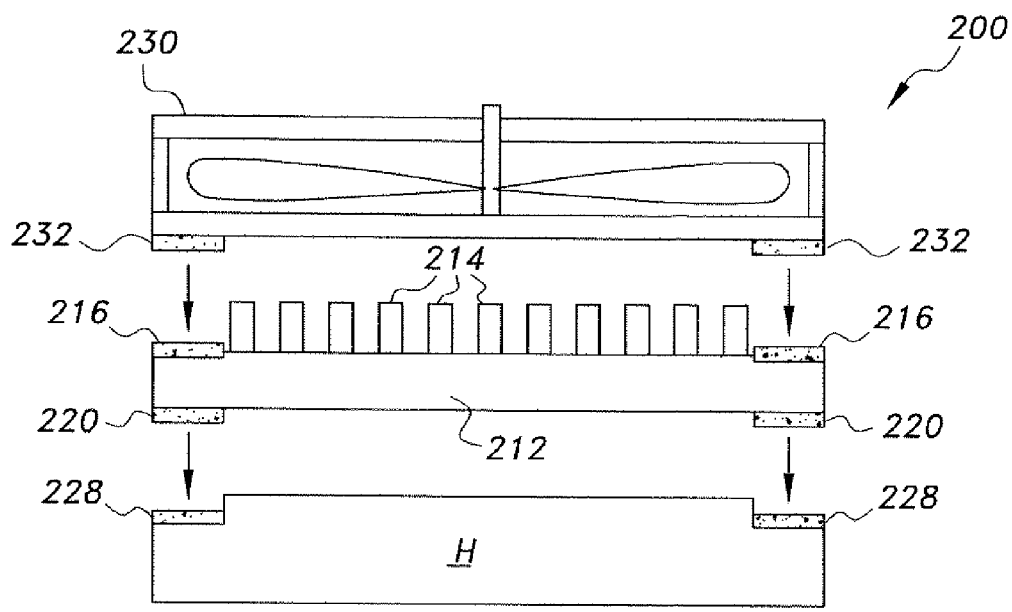
FIG. 5A is an exploded environmental side view of an add-on heat sink according to the present invention, showing an optional cooling fan.
Figure 5B:
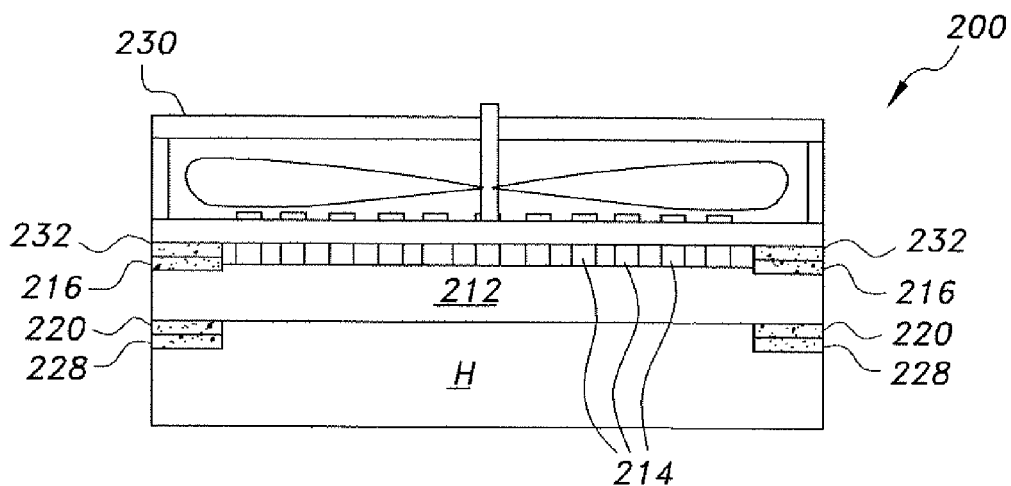
FIG. 5B is an environmental side view of the add-on heat sink of FIG. 5A, shown after attachment to a heated structure.

A still further alternative embodiment of the add-on heat sink 200 is shown in FIGS. 5A and 5B. The add-on heat sink 200 is substantially similar to the add-on heat sink 100 of FIGS. 4A-4B, but includes a fan 230 to increase heat dissipation from the fins. As shown, the add-on heat sink 200 includes an elongate base 212, a plurality of heat fins 214 extending from a surface of the base 212, a pair of first spaced magnetic layers or pads 220 at the bottom of the base 212, and a pair of second magnetic layers or pads 228 attached to the heated structure H. Thus, the base 212 and fins 214 are attached to the heated structure H in the same manner as the add-on heat sink 100. However, the add-on heat sink 200 also includes the aforementioned fan 230 selectively attached to the base 212. The fan preferably covers the fins 214 to pull or draw heated air away from the fins. Alternatively, the fan 230 can be configured to pass cooler ambient air through the fins 214 to cool the same. An exemplary fan for use in this configuration is the type used for cooling desktop computers. The fan 230 may have an internal battery power supply, or may be configured for connection to an external power supply.

As best seen in FIG. 5A, the top surface of the base 212 includes a pair of spaced third magnetic layers or pads 216. Correspondingly, the fan 230 also includes a pair of spaced fourth magnetic layers or pads 232 configured for connection with the magnetic pads 216. This type of arrangement permits selective use of the fan 230 when additional heat dissipation is required.

It is to be understood that the add-on heat sink 10, 100, 200 encompasses a wide variety of alternatives. For example, the shape of the add-on heat sink can be configured to match the shape of the intended heated structure. This will permit continuous surface-to-surface contact in order to maximize heat transfer.

It is to be understood that the present invention is not limited to the embodiments described above, but encompasses any and all embodiments within the scope of the following claims.

I claim:

1. An add-on heat sink, comprising:
an elongate planar base having a top surface, a bottom surface, and peripheral edges;
a plurality of heat sink fins extending upwardly from the top surface of the base and across the top surface at least partially between an opposed pair of the peripheral edges;
at least one magnetic layer disposed on the bottom surface of the base, the magnetic layer being adapted for attaching the base to a heated structure, wherein said at least one magnetic layer comprises at least one pair of first magnetic pads attached to the bottom of said base;
at least one pair of spaced second magnetic pads adapted for attachment to the heated structure, the first magnetic pads being magnetically attachable to the second magnetic pads;
at least one pair of third magnetic pads disposed on the top surface of said base;
a fan having a fan housing, the fan housing having a bottom surface; and
at least one pair of fourth magnetic pads attached to the bottom surface of the fan housing, the third and fourth magnetic pads being magnetically attachable to selectively secure the fan atop the heat sink fins in order to facilitate heat dissipation through the fins, wherein said fan at least partially covers said plurality of heat sink fins, said plurality of heat sink fins at least partially projecting within the fan housing.

2. The add-on heat sink according to claim 1, wherein said elongate planar base comprises an elongate plate constructed from thermally conductive material.

3. The add-on heat sink according to claim 2, wherein said plurality of heat sink fins comprises a plurality of plates projecting from said base, said fins being constructed from thermally conductive material.

4. The add-on heat sink according to claim 1, wherein said magnetic layer comprises a polymer matrix having a plurality of spaced thermally conductive structural components and a plurality of magnetic particles dispersed therein, the thermally conductive structural components providing increased heat transfer between the heated structure and said base.

5. The add-on heat sink according to claim 1, wherein said magnetic layer comprises a thermally conductive polymer matrix having a plurality of magnetic particles dispersed therein.

* * * * *